(12) United States Patent
Nagatomi et al.

(10) Patent No.: US 11,552,629 B1
(45) Date of Patent: Jan. 10, 2023

(54) SEMICONDUCTOR DEVICE AND MANUFACTURING METHOD THEREOF

(71) Applicant: RENESAS ELECTRONICS CORPORATION, Tokyo (JP)

(72) Inventors: Hiroki Nagatomi, Tokyo (JP); Makoto Tanaka, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 17/349,576

(22) Filed: Jun. 16, 2021

(51) Int. Cl.
*H03K 17/14* (2006.01)
*H01L 27/07* (2006.01)
*H01L 23/34* (2006.01)
*G01K 7/01* (2006.01)

(52) U.S. Cl.
CPC .............. *H03K 17/145* (2013.01); *G01K 7/01* (2013.01); *H01L 23/34* (2013.01); *H01L 27/0727* (2013.01)

(58) Field of Classification Search
CPC ........ H03K 17/145; G01K 7/01; H01L 23/34; H01L 27/0727
See application file for complete search history.

(56) References Cited

U.S. PATENT DOCUMENTS

| | | | |
|---|---|---|---|
| 5,162,669 A | 11/1992 | Hobelsberger | |
| 5,869,878 A | 2/1999 | Hasegawa | |
| 6,373,671 B1 | 4/2002 | Watanabe et al. | |
| 9,673,803 B2 | 6/2017 | Uemura et al. | |
| 2009/0091373 A1 | 4/2009 | Kiyohara | |
| 2016/0211657 A1 | 7/2016 | Hayashi | |
| 2016/0218501 A1 | 7/2016 | Eddleman et al. | |
| 2019/0064276 A1* | 2/2019 | Kawai | G01R 31/392 |

FOREIGN PATENT DOCUMENTS

| | | | |
|---|---|---|---|
| GB | 2 337 823 A | | 12/1999 |
| JP | 08-213441 A | | 8/1996 |
| JP | 2000298522 A | * | 10/2000 |
| JP | 2016-072935 A | | 5/2016 |

OTHER PUBLICATIONS

Extended European Search Report issued in corresponding European Patent Application No. 22177193.4-1211, dated Nov. 2, 2022.

* cited by examiner

*Primary Examiner* — Metasebia T Retebo
(74) *Attorney, Agent, or Firm* — McDermott Will & Emery LLP

(57) ABSTRACT

A semiconductor device includes a first transistor that flows a current to a load, a current generation circuit that outputs a current corresponding to a power consumption of the first transistor, a temperature sensor, a resistor-capacitor network coupled between the current generation circuit and the temperature sensor and an overheat detection circuit coupled to a connection point of the current generation circuit and the resistor-capacitor network, wherein the resistor-capacitor network comprises a resistor and a capacitor corresponding to a thermal resistance and a thermal capacitance between the first transistor and the temperature sensor.

18 Claims, 6 Drawing Sheets

SEMICONDUCTOR DEVICE AND MANUFACTURING METHOD THEREOF

BACKGROUND

The present invention relates to semiconductor device, particularly semiconductor device having a semiconductor element for power.

In order to drive a motor, a heater, a lamp or the like mounted on an automobile, a semiconductor element for power is used. As the semiconductor element for power, a power MOSFET or an IGBT (Insulated Gate Bipolar Transistor) is used. And, for miniaturization and cost reduction of products, a product called IPD (Intelligent Power Device) in which a power MOSFET chip and a control chip (including protective circuits) are mounted in one package is also used. In these semiconductor devices, overheat protection measures using temperature sensors such as diodes are important.

Patent Document 1 discloses a technique for reducing the thermal resistivity between the temperature sensing target element and the temperature sensing diode. Specifically, the temperature sensing diode is formed at a position surrounded by the temperature sensing target element. Further, it is disclosed that the temperature of the temperature sensing target element is determined by first-order approximate calculation or second-order approximate calculation depending on the distance from the temperature sensing diode.

Patent Document 2 discloses a technique for detecting the overtemperature of the output transistor by a diode D2 disposed in the vicinity of the output transistor and a diode D1 disposed in the peripheral circuit area away from the output transistor.

PRIOR-ART DOCUMENT

Patent Document

[Patent Document 1] Japanese Unexamined Publication Laid-Open No. 8-213441
[Patent Document 2] Japanese Unexamined Publication Laid-Open No. 2016-72935

SUMMARY

However, the temperature detection method according to the prior art is not highly accurate. In the first-order approximation and second-order approximation disclosed by Patent Document 1, the accuracy cannot be said to be sufficiently high. Also, in Patent Document 2, because it detects the overtemperature only by the diodes, the detection accuracy is not high. Higher precision temperature detection is desired.

Other objects and novel features will become apparent from the description of the specification and drawings.

A semiconductor device according to an embodiment includes a first transistor that flows a current to a load, a current generation circuit that outputs a current corresponding to a power consumption of the first transistor, a temperature sensor, a resistor-capacitor network coupled between the current generation circuit and the temperature sensor and an overheat detection circuit coupled to a connection point of the current generation circuit and the resistor-capacitor network, wherein the resistor-capacitor network comprises a resistor and a capacitor corresponding to a thermal resistance and a thermal capacitance between the first transistor and the temperature sensor.

According to the present invention, it is possible to detect overheating with high accuracy.

DETAILED DESCRIPTION

Figure 1:
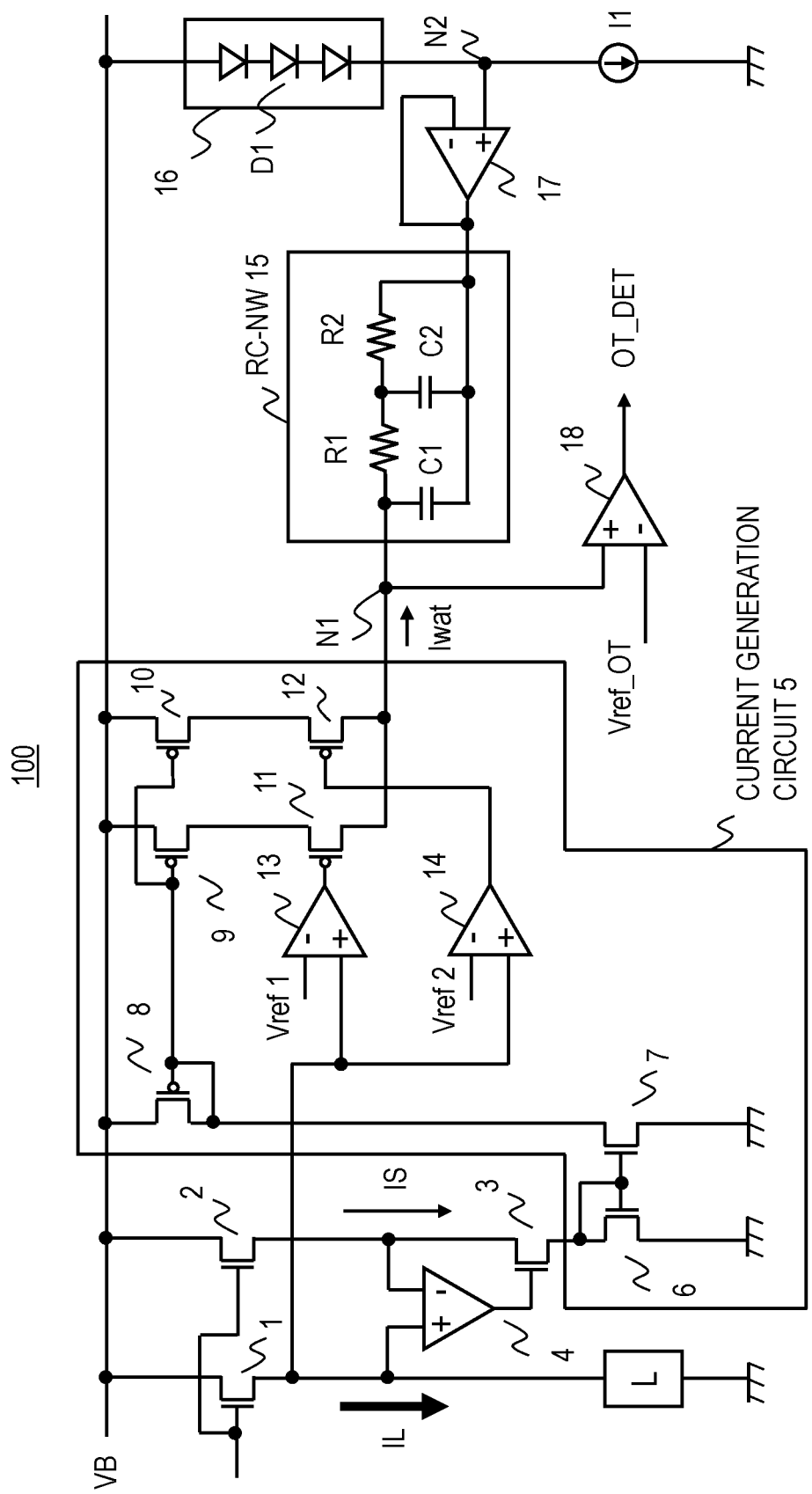
FIG. 1 is a schematic diagram of a semiconductor device according to first embodiment.

Hereinafter, a semiconductor device according to an embodiment will be described in detail by referring to the drawings. In the specification and the drawings, the same or corresponding form elements are denoted by the same reference numerals, and a repetitive description thereof is omitted. In the drawings, for convenience of description, the configuration may be omitted or simplified. Also, at least some of the embodiments may be arbitrarily combined with each other.

First Embodiment

FIG. 1 is a schematic diagram of a semiconductor device 100 according to first embodiment. Semiconductor device 100 has N-type transistors 1-3, differential amplifier 4, current generation circuit 5, resistor-capacitance network (RC-NW) 15, temperature sensor 16, voltage follower circuit (differential amplifier 17), overheat detection circuit (comparator 18), and constant current source I1. VB is a power voltage supply line. The power voltage is, for example, supplied from a battery. Transistor 1 is a power MOSFET (also referred to as a main-MOS) for driving the load L. Load L is connected to a source of the main MOS 1. Transistor 2 is connected in parallel with the main MOS 1 and is a power MOSFET (also referred to as a sense MOS) for detecting the current flowing through the main MOS 1. The sense MOS 2 has the same cell structure as the main MOS 1, but differs in cell counts. A common control signal is connected to the gates of the main MOS 1 and sense MOS 2. The drain of the transistor 3 is connected to the source of the sense MOS 2. The non-inverting input terminal of the differential amplifier 4 is connected to the source of the main MOS 1. The inverting input terminal of the differential amplifier 4 is connected to the source of the sense MOS 2. The output of the differential amplifier 4 is connected to the gate of transistor 3.

The current generation circuit 5 includes N-type transistors 6, 7, P-type transistors 8-12, comparators 13, 14. Transistors 6 and 7 constitute a first current mirror circuit. The source of the transistor 3 is connected to the drain of the transistor 6, Transistors 8-10 constitute a second current mirror circuit and are connected to a first current mirror circuit. The second current mirror circuit is configured such that the current flowing ratio through the transistors 9 and 10 is 1:1. The source of the transistor 11 is connected to the drain of the transistor 9. The source of the transistor 12 is connected to the drain of the transistor 10. The non-inverting input terminal of the comparator 13 is connected to the source of the main MOS 1. The inverting input terminal of the comparator 13 is connected to the reference voltage Vref 1. The output of comparator 13 is connected to the gate of transistor 11. The non-inverting input terminal of the comparator 14 is connected to the source of the main MOS 1. The inverting input terminal of the comparator 14 is connected to the reference voltage Vref 2. The output of comparator 14 is connected to the gate of transistor 12.

The temperature sensor 16 is composed of n-stage diodes D1 connected in series. The temperature sensor 16 is connected to the constant current source I1. The connection node N2 of the temperature sensor 16 and the constant current source I1 is connected to the voltage follower circuit (differential amplifier 17). The temperature sensor 16 is preferably located in the vicinity of the main MOS 1.

The output of the second current mirror (node N1) is connected to one end of the resistor-capacitor network (RC-NW) 15. The other end of the resistor-capacitor network RC-NW is connected to the output of the voltage follower circuit 17. The node N1 is connected to the overheat detection circuit (comparator 18). The inverting input terminal of the comparator 18 is connected to the reference voltage Vref_OT.

Figure 2:
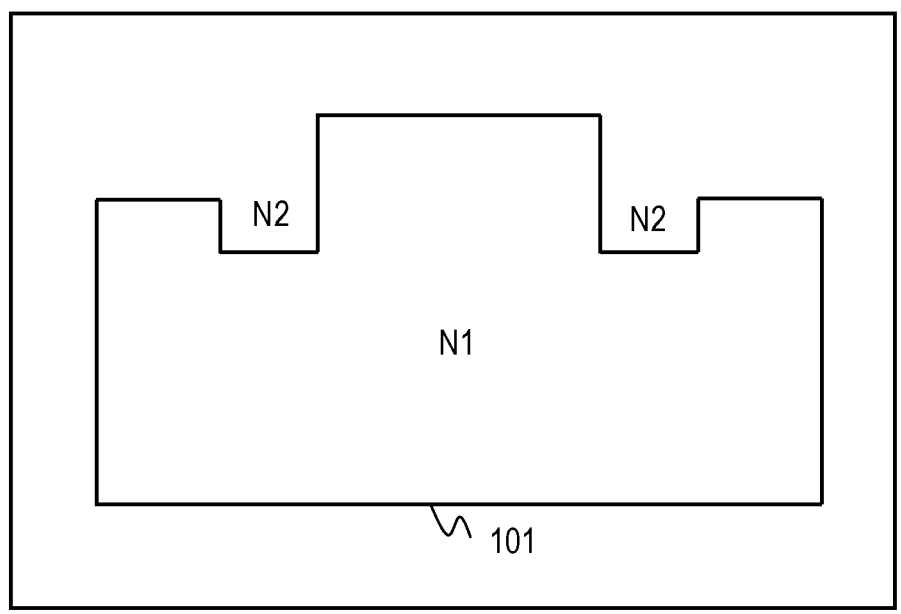
FIG. 2 is a plan view of semiconductor device according to first embodiment.

Here, the resistor-capacitor network 15 will be described with reference to FIG. 2. FIG. 2 is an image diagram of the surface of semiconductor device 100 for illustrating features of the resistor-capacitor network 15. Incidentally, for clarity, such as a source pads and a gate pad formed on the surface of semiconductor device 100 are omitted. Each transistor of semiconductor device 100 is formed in the region 101 (the main MOS 1 occupies the majority). Diode D1 constituting the temperature sensor 16 is formed at the N2 point (in FIG. 2, the diodes D1 are formed at two places). N2 is a position apart a predetermined distance from the center point N1 of the region 101 which tends to become high heat. A time corresponding to the distance is required for the heat generated in N1 to be transferred to N2. Due to this transfer time, the temperature indicated by the temperature sensor 16 may greatly deviate from the temperature of the power MOSFET. For example, there is a case where the power MOSFET radically generates heat in a short time. In this case, the power MOSFET is at a higher temperature than the temperature indicated by the temperature sensor 16, so the power MOSFET may become thermally destroyed if its operation is continued. In order to prevent thermal destruction, the threshold temperature, which is judged to be abnormal temperature, should be lowered and the heat resistance of the power MOSFET should be raised. However, in this method, it leads to performance deterioration of the semiconductor chip and chip area increase. Therefore, in the present first embodiment, the heat transfer between N1 and N2 is incorporated in the overheat detecting circuit using the resistor-capacitor network 15. Thus, it is possible to increase the overheat detection accuracy of semiconductor device, it is possible to suppress the performance degradation and chip area increase of the semiconductor chip.

The resistor-capacitor network 15 is Cauer equivalent circuit. Resistors R1, R2, capacitors C1, C2 constituting the resistor-capacitor network 15 correspond to the thermal resistance and thermal capacitance between the temperature sensor 16 and the main MOS 1. Since Cauer equivalent circuit is generally known, its detailed description is omitted.

Next, the operation of semiconductor device 100 according to first embodiment will be described with reference to FIG. 1. First, the control voltages are applied to the gates of the main MOS 1 and sense MOS 2 to cause semiconductor device 100 to perform the desired operation. For example, a PWM (Pulse Width Modulation) method is used to control the gate voltages. When the control voltage is applied to the gate, a load current IL flows through the main MOS 1. The differential amplifier 4 and transistor 3 control the sense current IS so that the source voltage of the main MOS 1 and the source voltage of the sense MOS 2 are equal. As a result of this control, the sense current IS is a current corresponding to the sense ratio of the main MOS 1 and the sense MOS 2 (e.g., 1000:1) with respect to the load current IL.

Next, the operation of the current generation circuit 5 will be described. Sense current IS, by the first and second current mirror circuits, is drain currents of the transistors 9 and 10. Comparators 13 and 14 compare the on-voltage Von (Vds) of the main MOS 1 with the reference voltages Vref 1, Vref 2. The gate of the transistor 11 is connected to the output of the comparator 13. The gate of the transistor 12 is connected to the output of the comparator 14. When the on-voltage Von is increased, the voltage of the non-inverting inputs of the comparators 13 and 14 are lowered. Transistors 11 is turned on when the voltage of the non-inverting input of comparator 13 falls below Vref 1. Transistors 12 is turned on when the voltage of the non-inverting input of comparator 14 falls below Vref 2. That is, each of the drain currents of the transistors 11 and 12 is a current determined by the sense current IS and the on-voltage Von. Output current Iwat of the current generation circuit 5 is a combined current of the currents flowing through the transistors 11 and 12. The current Iwat becomes proportional to the sense current IS and the on-voltage Von of the main MOS 1, and Iwat cc Von*IS.

Temperature sensor 16 is composed of an n-stage diode D1. When the current flows by the constant current circuit I1, a voltage of the node N2 is VB-Vf (Vf is the forward voltage of the diode D1). Because Vf has a temperature dependence (about-2 mV/° C.), the voltage at node N2 varies according to the ambient temperature.

Resistor-capacitor network 15, as described above, corresponds to the thermal resistance and thermal capacitance between the main MOS 1 and N2. The junction temperature Tch of the power MOSFET is expressed by Tch=Ta+Zth*P. Where Ta is the ambient temperature, Zth is the transient thermal resistance, and P is the power consumption. The voltage of the node N2 (or the output voltage of the voltage follower circuit 17) corresponds to Ta. The resistor-capacitor network 15 corresponds to Zth. The output current Iwat of the current generation circuit 5 is proportional to Von*IS, i.e. the power consumption of the main MOS 1. Therefore, when the output current Iwat of the current generation circuit 5 flows through the resistor-capacitor network 15, a voltage corresponding to the junction temperature Tch of the power MOSFET will be generated in the node N1.

Overheat detecting circuit (comparator 18) compares the voltage of the node N1 and reference voltage Vref_OT, and outputs the comparison result as OT_DET signal. Reference voltage Vref_OT is previously set to a voltage for detecting an overheat condition. The overheat detecting circuit 18 outputs a Hi level when the power MOSFET is overheated, and outputs a Low level when not overheated.

The output OT_DET of the overheat detecting circuit 18 is output to, for example, an external microcontroller. The microcontroller performs control such as stopping the operation of the main MOS 1 when an overheat of the power MOSFET is detected.

As described above, in semiconductor device 100 according to present first embodiment, the current generation circuit 5 for outputting the current proportional to the power consumption by the power MOSFET (main MOS 1), the temperature sensor 16, and the resistor-capacitor network 15 installed between the temperature sensor and the current generation circuit 5. Thus, high accuracy overheat detection becomes possible.

Resistance and capacitance constituting the resistor-capacitor network 15 (R1, R2, C1, C2), as described above, correspond to the thermal resistance and thermal capacitance between the temperature sensor 16 and the power MOSFET. If the distance between the temperature sensor 16 and the power MOSFET is short, the resistance value and the capacitance value can be significantly reduced. Therefore, the time constant of the resistor-capacitor network 15 can be reduced. This is advantageous when the main MOS 1 is switched on/off at high speed, such as in the PWM-control scheme.

Present embodiment is not limited to the above, and may be variously changed within a range not deviating from the gist thereof. For example, the current generation circuit 5 generates a current Iwat in the two transistors 11 and 12 is not limited thereto. The current Iwat may be generated by three or more transistors. In this case, the second current mirror circuit may output three or more currents, the three or more comparators may also be installed.

The resistor-capacitor network 15 has two stages of combination of resistance and capacitance, but may be one stage or three or more stages.

Second Embodiment

Figure 3:
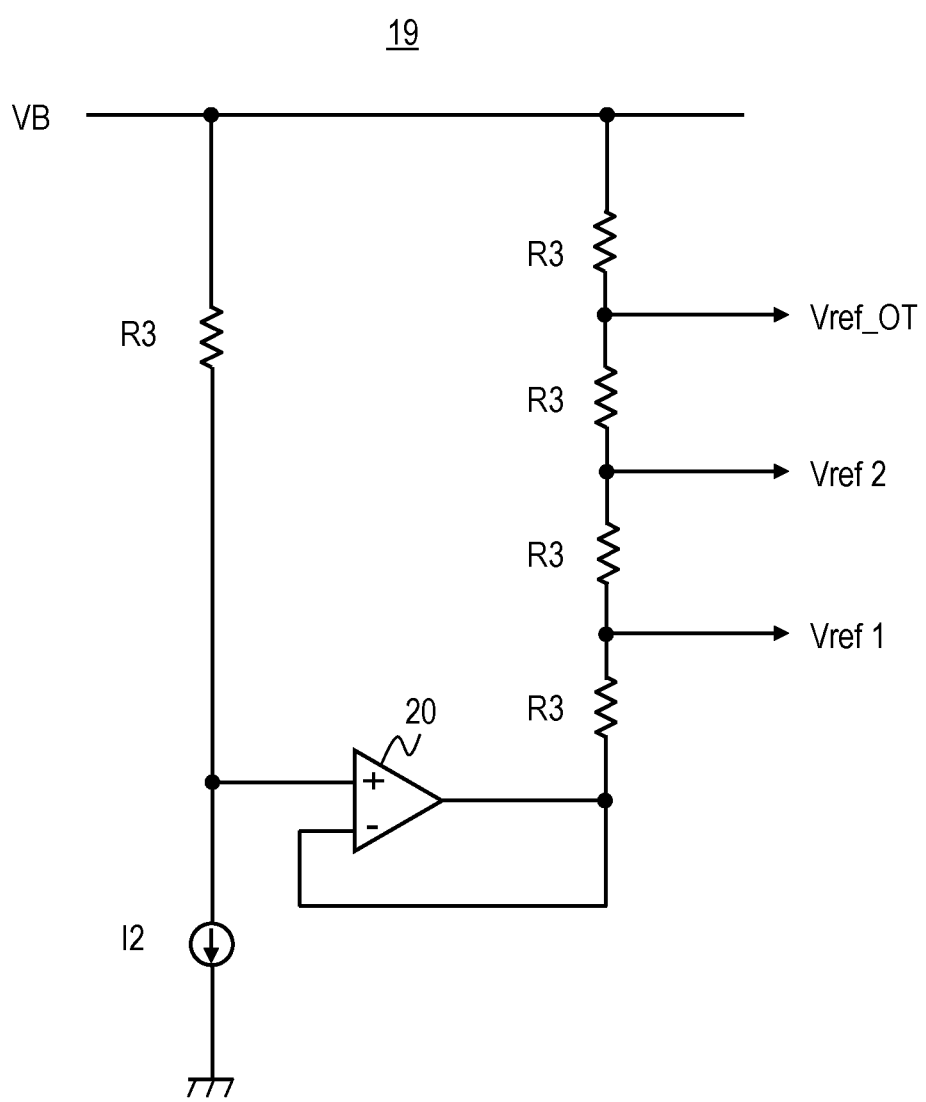
FIG. 3 is a circuit diagram of a reference voltage generation circuit according to second embodiment.

Semiconductor device according to second embodiment is the same as that of 100 in FIG. 1. FIG. 3 is a circuit diagram of reference voltage generation circuit 19 used in second embodiment. As shown in FIG. 3, reference voltage generation circuit 19 has a differential amplifier 20, resistors R3, a constant current source 12. Reference voltage generation circuit 19 outputs a voltage obtained by dividing the voltage between VB and an output of the differential amplifier 20 by the resistors R3 as the reference voltages Vref_OT, Vref 1 and Vref 2. That is, each of reference voltages Vref_OT, Vref 1 and Vref 2 is a voltage based on the voltage VB. All of the resistors R3 need not have the same resistance value.

When semiconductor device 100 is installed in a car, the power supply VB is supplied from a battery. The voltage supplied from the battery is expected to fluctuate due to the state of charge of the battery, etc. When the voltage VB fluctuates, the voltage of the nodes N1 and N2 will also fluctuate. Therefore, in this second embodiment, reference voltages Vref_OT, Vref 1 and Vref 2 are generated based on VB so as to follow its voltage variation.

Since the operation of semiconductor device 100 is the same as that of first embodiment, the detailed description thereof is omitted.

As described above, in semiconductor device 100 according to the present second embodiment, in addition to the same effects as those of first embodiment, variations in power supply voltage can be followed.

Third Embodiment

Figure 4:
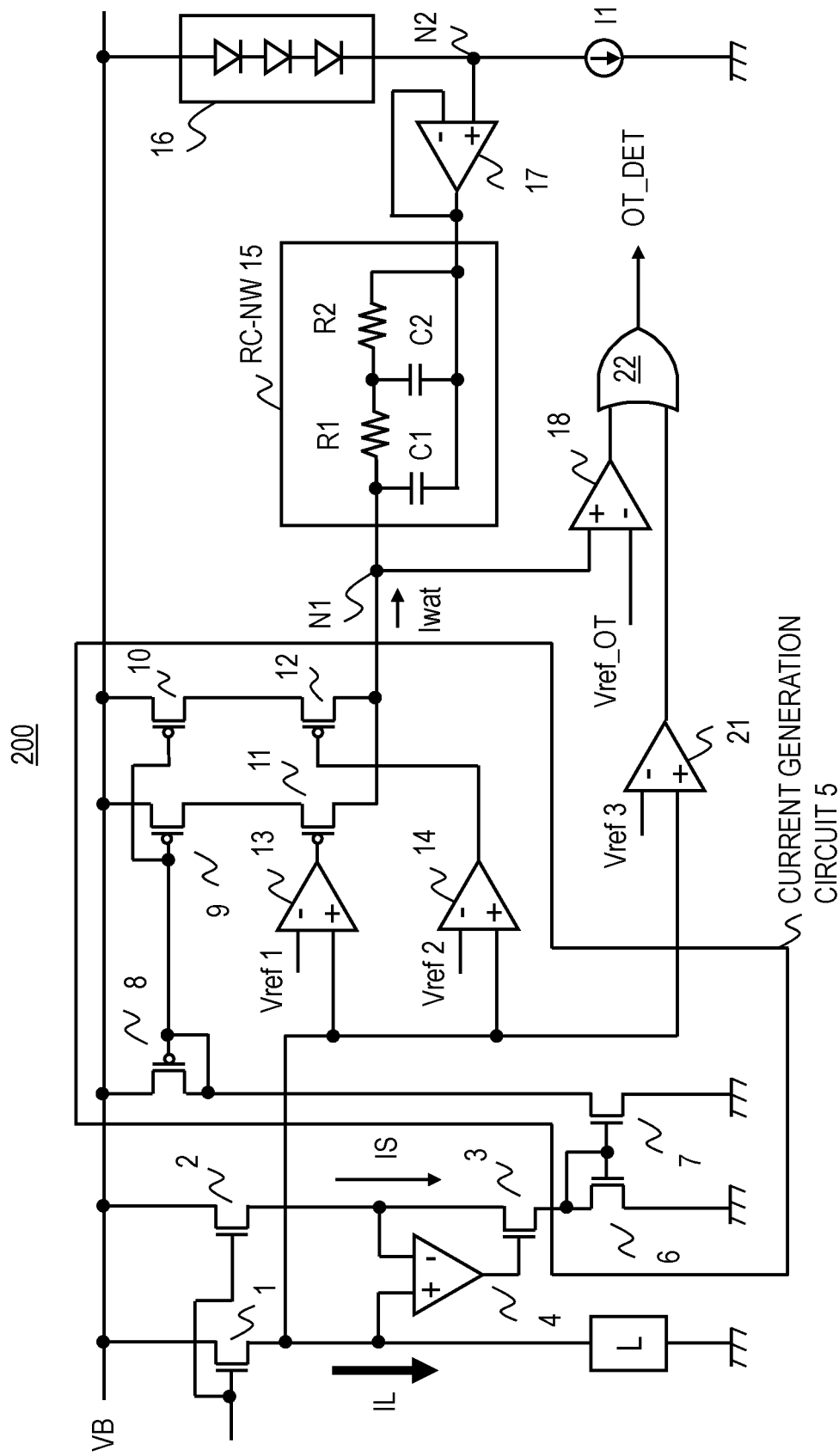
FIG. 4 is a schematic diagram of a semiconductor device according to third embodiment.

FIG. 4 is a schematic diagram of a semiconductor device 200 according to third embodiment. The difference from first embodiment is that the comparator 21 and the OR circuit 22 are added as an overheat detecting circuit. The non-inverting input terminal of the comparator 21 is connected to source of the main MOS 1, the inverting input terminal is connected to the reference voltage Vref 3. The outputs of the comparators 18 and 21 are inputted to the OR circuit 22. The OR circuit 22 outputs a signal as an overheat detection signal OT_DET.

The basic operation of semiconductor device 200 is similar to that of first embodiment. In semiconductor device 200, as shown in FIG. 4, the comparator 21 compares the source-voltage of the main MOS 1 with the reference voltage Vref 3. When the source voltage exceeds Vref 3, the overheat detecting signal OT_DET is outputted regardless of the voltage of the node N1.

Figure 5:
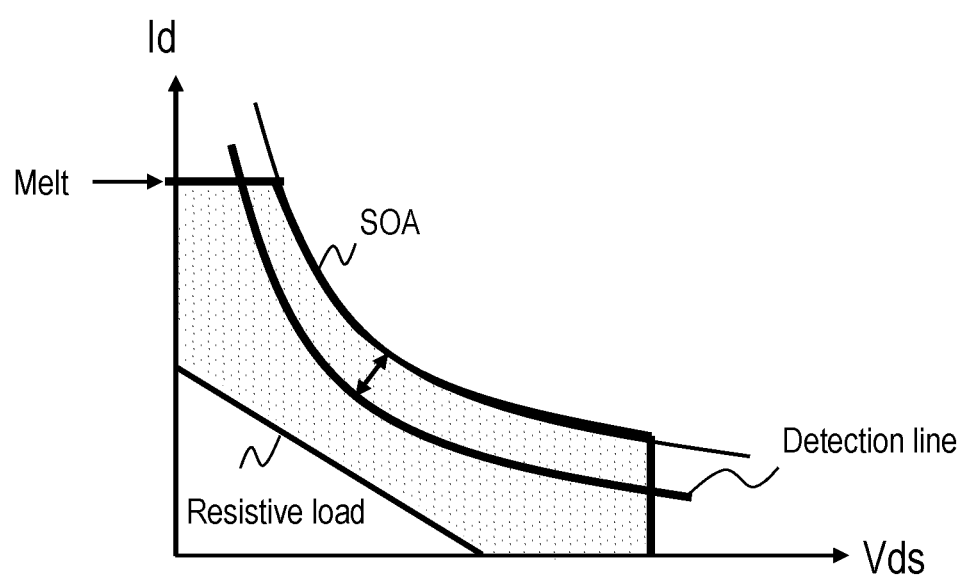
FIG. 5 is a diagram for explaining the operation of semiconductor device according to third embodiment.

The meaning of comparing the source-voltage of the main MOS 1 with Vref 3 will be described with reference to FIG. 5. FIG. shows a SOA (Safety Operation Area) of the power MOSFET. Operating the power MOSFET in region above the SOA (the drain current Id above the SOA line) thermally destroys the power MOSFET. First embodiment can be controlled not to exceed the SOA by properly setting Vref_OT (see Detection line in FIG. 5). However, semiconductor device does not consist solely of power MOSFET. Specifically, semiconductor device includes bonding wires for connecting the pads on the semiconductor chip to the terminals of the semiconductor package. The bonding wires may be fused when a large current flows. This condition is indicated by Melt line in FIG. 5. That is, even if the power MOSFET operates in the SOA-region, there is a case where the bonding wire is melted. Therefore, in present third embodiment, in addition to monitoring the SOA region, the comparator 21 monitors Melt. By appropriately setting Vref 3 (Vref 3>Vref 2>Vref 1), Melt can be monitored, and even if the semiconductor device operates in the SOA region, the failure of semiconductor device due to the fusing of the bonding wire can be prevented.

As described above, in semiconductor device 200 according to present third embodiment, in addition to the same effects as those of first embodiment, the bonding wire can be prevented from being meltdown or the like.

Fourth Embodiment

Figure 6:
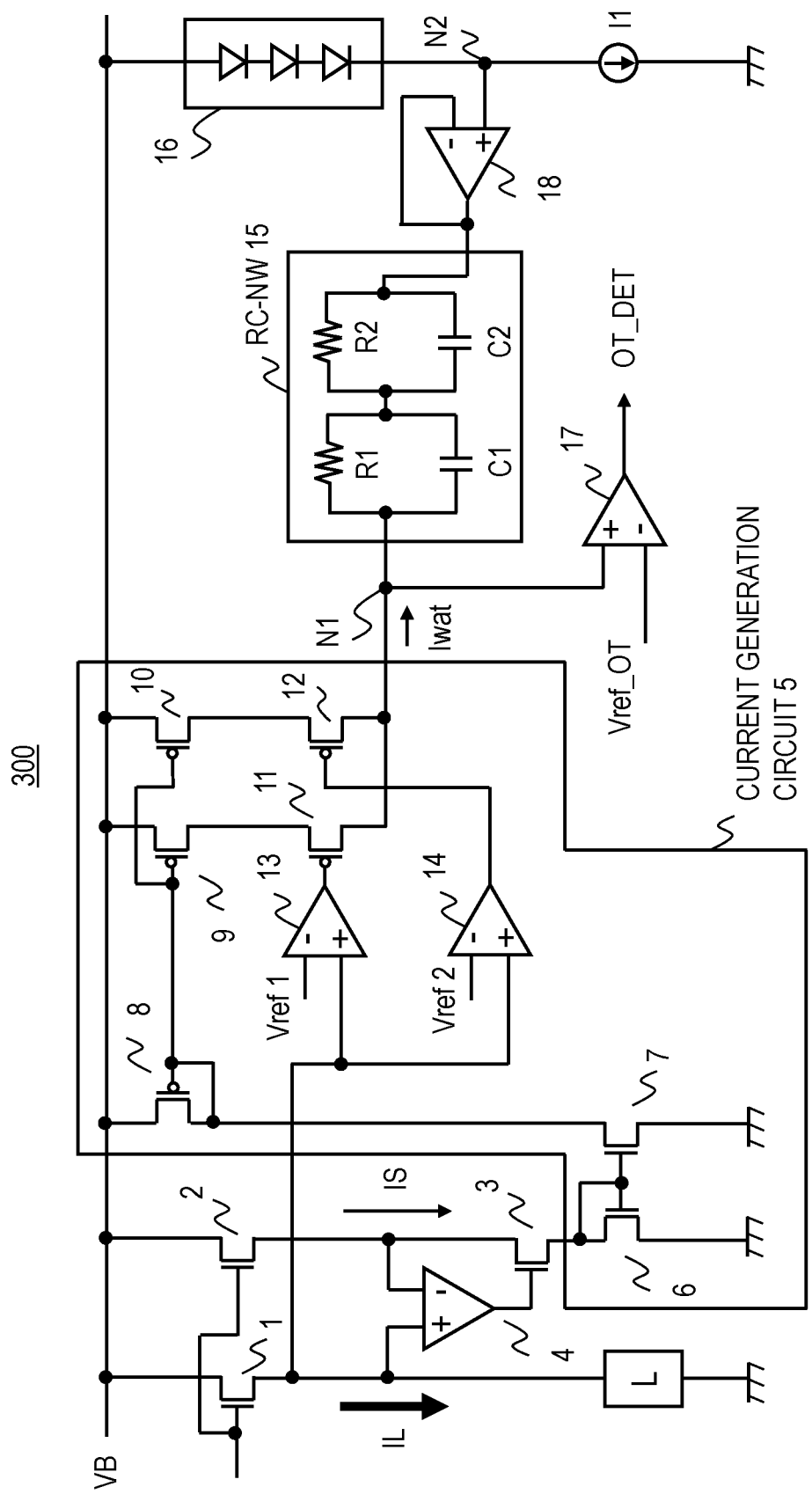
FIG. 6 is a schematic diagram of semiconductor device according to fourth embodiment.

FIG. 6 is a schematic diagram of a semiconductor device 300 according to fourth embodiment. The difference from first embodiment is the resistor-capacitor networking (RC-NW) 15. In first embodiment, the resistor-capacitor network (RC-NW) 15 consists of a Cauer type equivalent circuit, but in this fourth embodiment, it consists of a Foster type equivalent circuit. Similar to first embodiment, resistors R1, R2, capacitors C1, C2 correspond to the thermal resistance and heat capacitance between the temperature sensor 16 and the power MOSFET. Compared with Cauer type equivalent circuit, Foster type equivalent circuit has the merit that it is not complicated, and it is easy to calculate by a digital circuit. Since Foster type equivalent circuit is generally known, its detailed descriptions are omitted.

As described above, semiconductor device 300 according to the present fourth embodiment can obtain the same effects as those of first embodiment.

It should be noted that the present invention is not limited to the above-mentioned embodiments, and various modifications can be made without departing from the gist thereof. For example, second embodiment may be combined with third and fourth embodiments.

What is claimed is:

1. A semiconductor device, comprising:
a first transistor that flows a current to a load;
a current generation circuit that outputs a current corresponding to a power consumption of the first transistor;
a temperature sensor;
a resistor-capacitor network coupled between the current generation circuit and the temperature sensor; and
an overheat detection circuit coupled to a connection point of the current generation circuit and the resistor-capacitor network,
wherein the resistor-capacitor network comprises a resistor and a capacitor corresponding to a thermal resistance and a thermal capacitance between the first transistor and the temperature sensor.

2. The semiconductor device according to claim 1, further comprising:
a second transistor coupled in parallel to the first transistor,
wherein the current generation circuit comprises:
a current mirror circuit having first and second outputs to output a current corresponding to a current flowing through the second transistor;
a third transistor that is coupled to the first output of the current mirror circuit and is controlled in response to a drain-source voltage of the first transistor; and
a fourth transistor that is coupled to the second output of the current mirror circuit and is controlled in response to the drain-source voltage of the first transistor, and
wherein a combined current of output currents of the third and fourth transistors is outputted as the current corresponding to the power consumption of the first transistor.

3. The semiconductor device according to claim 2,
wherein the current generation circuit further comprises:
a first comparator coupled to a gate of the third transistor; and
a second comparator coupled to a gate of the fourth transistor,
wherein non-inverting inputs of the first and second comparators are coupled to an output of the first transistor,
wherein an inverting input of the first comparator is coupled to a first reference voltage, and
wherein an inverting input of the second comparator is coupled to a second reference voltage.

4. The semiconductor device according to claim 3, further comprising:
a fifth transistor coupled between the current generation circuit and the second transistor; and
a differential amplifier coupled to a gate of the fifth transistor,
wherein a non-inverting input of the differential amplifier is coupled to the output of the first transistor, and
wherein an inverting input of the differential amplifier is coupled to an output of the second transistor.

5. The semiconductor device according to claim 4, further comprising:
a constant current source coupled to the temperature sensor; and
a voltage follower circuit coupled between the temperature sensor and the resistor-capacitor network.

6. The semiconductor device according to claim 4,
wherein the overheat detection circuit comprises a third comparator,
wherein a non-inverting input of the third comparator is coupled to the connection point, and
wherein an inverting input of the third comparator is coupled to a third reference voltage.

7. The semiconductor device according to claim 6, further comprising:
a power supply wiring that supplies a power supply voltage to the first and second transistors, the current generation circuit and the temperature sensor,
wherein the first to third reference voltages are generated by a plurality of resistors coupled to the power supply wiring.

8. The semiconductor device according to claim 6,
wherein the overheat detection circuit further comprises a fourth comparator and an OR circuit,
wherein a non-inverting input of the fourth comparator is coupled to the output of the first transistor,
wherein an inverting input of the fourth comparator is coupled to a fourth reference voltage, and
wherein outputs of the third and fourth comparators are inputted to the OR circuit.

9. The semiconductor device according to claim 1, wherein the temperature sensor comprises a plurality of diodes coupled in series.

10. The semiconductor device according to claim 1, wherein the resistor-capacitor network is a Cauer type equivalent circuit.

11. The semiconductor device according to claim 1, wherein the resistor-capacitor network is a Foster type equivalent circuit.

12. A semiconductor device, comprising:
a first N-type transistor that supplies a current to a load;
a second N-type transistor coupled in parallel to the first N-type transistor;
a third N-type transistor whose drain is coupled to a source of the second N-type transistor;
a differential amplifier whose non-inverting input is coupled to a source of the first N-type transistor, whose inverting input is coupled to the source of the second N-type transistor and whose output is coupled to a gate of the third N-type transistor;
a first current mirror circuit coupled to a source of the third N-type transistor;
a second current mirror circuit coupled to the first current mirror circuit and having a first and second outputs;
a first P-type transistor whose source is coupled to the first output of the second current mirror and whose drain is coupled to a first node;
a second P-type transistor whose source is coupled to the second output of the second current mirror and whose drain is coupled to the first node;
a first comparator whose non-inverting input is coupled to the source of the first N-type transistor, whose inverting input is coupled to a first reference voltage and whose output is coupled to a gate of the first P-type transistor;
a second comparator whose non-inverting input is coupled to the source of the first N-type transistor, whose inverting input is coupled to a second reference voltage and whose output is coupled to a gate of the second P-type transistor;
a temperature sensor;
a constant current source coupled to the temperature sensor at a second node;
a voltage follower circuit coupled to the second node;
a resistor-capacitor network coupled to the first node and the voltage follower circuit; and an overheat detection circuit coupled to the first node,
wherein the resistor-capacitor network comprises a resistance and a capacitor corresponding to a thermal resistance and a thermal capacitance between the first N-type transistor and the temperature sensor.

13. The semiconductor device according to claim 12,
wherein the overheat detection circuit comprises a third comparator,
wherein a non-inverting input of the third comparator is coupled to the first node, and
wherein an inverting input of the third comparator is coupled to a third reference voltage.

14. The semiconductor device according to claim 13,
wherein the overheat detection circuit further comprises a fourth comparator and an OR circuit,
wherein a non-inverting input of the fourth comparator is coupled to the source of the first N-type transistor,
wherein an inverting input of the fourth comparator is coupled to a fourth reference voltage, and
wherein outputs of the third and fourth comparators are inputted to the OR circuit.

15. The semiconductor device according to claim 12, wherein the temperature sensor comprises a plurality of diodes coupled in series.

16. The semiconductor device according to claim 12, wherein the resistor-capacitor network is a Cauer type equivalent circuit.

17. The semiconductor device according to claim 12, wherein the resistor-capacitor network is a Foster type equivalent circuit.

18. The semiconductor device according to claim 12, wherein each of the first and second N-type transistors is a power MOSFET.

\* \* \* \* \*